United States Patent
Henmi et al.

(10) Patent No.: US 9,136,846 B2
(45) Date of Patent: Sep. 15, 2015

(54) LEVEL SHIFT CIRCUIT AND DRIVE CIRCUIT OF DISPLAY DEVICE

(71) Applicant: Renesas Electronics Corporation, Kawasaki-shi, Kanagawa (JP)

(72) Inventors: Isao Henmi, Kawasaki (JP); Yutaka Saeki, Kawasaki (JP); Kiyoshi Miyazaki, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 59 days.

(21) Appl. No.: 13/724,224

(22) Filed: Dec. 21, 2012

(65) Prior Publication Data

US 2013/0162294 A1 Jun. 27, 2013

(30) Foreign Application Priority Data

Dec. 22, 2011 (JP) ................. 2011-281108

(51) Int. Cl.
  *H03K 19/094* (2006.01)
  *H03K 19/0185* (2006.01)
  *H03L 5/00* (2006.01)
  *G09G 3/20* (2006.01)

(52) U.S. Cl.
  CPC .......... *H03K 19/018507* (2013.01); *G09G 3/20* (2013.01); *H03L 5/00* (2013.01); *G09G 2310/027* (2013.01); *G09G 2310/0289* (2013.01)

(58) Field of Classification Search
  CPC .............................................. G09G 2310/0289
  USPC ............................. 326/63, 68–71, 80, 81, 83
  See application file for complete search history.

(56) References Cited

U.S. PATENT DOCUMENTS

| | | | | |
|---|---|---|---|---|
| 5,378,932 A | * | 1/1995 | Shin et al. | 327/333 |
| 5,510,731 A | * | 4/1996 | Dingwall | 326/63 |
| 5,933,043 A | * | 8/1999 | Utsunomiya et al. | 327/333 |
| 6,930,518 B2 | * | 8/2005 | Kim et al. | 327/112 |
| 7,348,801 B2 | * | 3/2008 | Nojiri | 326/81 |
| 7,880,501 B2 | * | 2/2011 | Han et al. | 326/68 |
| 8,237,487 B2 | * | 8/2012 | Shim | 327/333 |
| 2008/0238481 A1 | * | 10/2008 | Maede et al. | 326/68 |
| 2009/0021292 A1 | * | 1/2009 | Yu et al. | 327/333 |
| 2010/0127753 A1 | | 5/2010 | Shim | |

FOREIGN PATENT DOCUMENTS

| | | |
|---|---|---|
| JP | 4-284021 A | 10/1992 |
| JP | 5-199101 A | 8/1993 |
| JP | H05-300001 A | 11/1993 |

OTHER PUBLICATIONS

Japanese Office Action dated Jan. 16, 2015 with and English Translation thereof.

* cited by examiner

*Primary Examiner* — Don Le
(74) *Attorney, Agent, or Firm* — McGinn IP Law Group, PLLC

(57) ABSTRACT

In a level shift circuit, input signals are input into gates of a first and a second MOS transistors whose sources are coupled to a first supply voltage VSS. Gates of a third and a fourth MOS transistors whose sources are coupled to a second supply voltage are coupled to drains of the second and the first MOS transistors. A first voltage generation circuit is coupled between the drains of the first and the third MOS transistors, and a second voltage generation circuit is coupled between the drains of the second and the fourth MOS transistors. The gate of the fifth MOS transistor is coupled to a connection node NDB, and the source of the fifth MOS transistor is coupled to the second supply voltage.

19 Claims, 9 Drawing Sheets

US 9,136,846 B2

LEVEL SHIFT CIRCUIT AND DRIVE CIRCUIT OF DISPLAY DEVICE

CROSS-REFERENCE TO RELATED APPLICATION

The disclosure of Japanese Patent Application No. 2011-281108 filed on Dec. 22, 2011 including the specification, drawings and abstract is incorporated herein by reference in its entirety.

BACKGROUND

The present invention relates to a drive circuit of a display device, and in particular to a level shift circuit that converts a signal level of a digital signal.

The level shift circuit converts a digital signal having an amplitude between a reference supply voltage (VSS) and a low supply voltage (VDD1) into a digital signal having an amplitude between the reference supply voltage and a high supply voltage (VDD2).

The level shift circuit is disclosed in, for example, Japanese Patent Laid-Open No. 1993-199101 (Patent Document 1). As shown in FIG. 1, the circuit includes resistances R91 and R92 between drains of transistors P91 and N91 and between drains of transistors P92 and N92, respectively. The sources of the transistors P91 and P92 are coupled to the high supply voltage VDD2. The sources of the transistors N91 and N92 are coupled to the reference supply voltage VSS. The gate of the transistor P91 is coupled to a connection node B of the resistance R92 and the transistor N92. The gate of the transistor P92 is coupled to a connection node A of the resistance R91 and the transistor N91. An inverter 90 operates by being supplied with the reference supply voltage VSS and the low supply voltage VDD1, and logically inverts an input signal IN to thereby output the inverted signal as an input signal INB. The input signal IN is applied to the gate of the transistor N91 and the input signal INB output from the inverter 90 is applied to the gate of the transistor N92.

Inverters 91 and 92 operate by being supplied with the reference supply voltage VSS and the high supply voltage VDD2. The inverter 91 outputs an output signal Q1 which is logically inverted based on a voltage of the node A. The inverter 92 outputs an output signal Q2 which is logically inverted based on a voltage of the node B. The output signal Q1 output from the inverter 91 serves as a normal output of the level shift circuit and the output signal Q2 output from the inverter 92 serves as an inverted output of the level shift circuit. In this circuit, the gate of the inverter 91 coupled to the node A is used, as a resistance, for the resistance R91 and the gate of the inverter 92 coupled to the node B is used, as a resistance, for the resistance R92. Thereby, it is not necessary to newly insert the resistances R91 and R92, and thus the chip size of a circuit which shifts levels of many signals can be reduced. From the viewpoint of left-right symmetry of the circuit, it is preferable that the transistors N91 and N92 and the transistors P91 and P92 have the same dimensions (W/L) respectively and the resistances R91 and R92 have the same resistance value.

An operation of the level shift circuit will be described. When a sufficient time has elapsed since the input signal IN became low level (VSS) and thus the circuit is stable, the transistor N91 is turned off and the transistor N92 is turned on. Therefore, the drain of the transistor N92 (the node B) is at low level and the transistor P91 is turned on. The transistor N91 is turned off, and thus in a path from the high supply voltage VDD2 to the transistor P91, the resistance R91, the transistor N91, and the reference supply voltage VSS in this order, no current other than an ignorable leakage current flows. Since no current flows, voltages at both ends of the resistance R91 are the same and voltage of the node A is at high level near the high supply voltage VDD2. Since the node A is at high level, the transistor P92 is turned off, and thus in a path from the high supply voltage VDD2 to the transistor P92, the resistance R92, the transistor N92, and the reference supply voltage VSS in this order, no current other than an ignorable leakage current flows. Since no current flows, voltage of the node B is at low level near the reference supply voltage VSS.

After that, when the input signal IN changes from low level to high level, the output of the inverter 90 quickly changes from high level to low level. If the voltage of the input signal IN is sufficiently higher than a threshold voltage Vtn of an N-channel MOS transistor, the transistor N91 changes from off to on and the transistor N92 changes from on to off. At this time, even if the transistor N92 is turned off, the transistor P92 is also in an off state, and thus the voltage of the node B does not change at low level. Therefore, the transistor P91 still remains in an on state, and thus an initial current (a through-current) determined by on-resistance of the transistor N91, on-resistance of the transistor P91, and the resistance R91 flows in the resistance R91.

When the initial current flows in the resistance R91, a voltage drop occurs and the voltage of the node A drops by the voltage drop from the drain voltage of the transistor P91. When the voltage of the node A ($V_A$) is lower than a threshold voltage Vtp (negative value) of the transistor P92 ($V_A \leq VDD2+Vtp$), that is, when the gate-source voltage (the gate voltage) of the transistor P92 is smaller than the threshold voltage Vtp, the transistor P92 is turned on. At this time, the transistor N92 is off, and thus the node B gradually becomes high level. Therefore, when the gate voltage of the transistor P91 rises and the gate-source voltage (the gate voltage) of the transistor P91 becomes greater than the threshold value Vtp, the transistor P91 is turned off. Since the transistor N91 is turned on, the node A becomes low level. When a sufficient time has elapsed in this state, the circuit is stabilized in a state opposite to the state where the input signal IN is low level. When the input signal IN changes from high level to low level, the level shift circuit operates on the same principle because the circuit is left-right symmetry.

When the resistance R91 (R92) is 0Ω and the voltage drop by the initial current is 0 volt, that is, in a case of a level shift circuit which has no resistance R91 (R92) and in which transistors are directly coupled to each other, the transistor N91 (N92) requires a relatively large drive capability. That is, in a state in which the gate voltage is the voltage VDD1 which is the maximum value of the input signal IN and the drain-source voltage Vds is a voltage near 0 volt, the transistor N91 (N92) is required to have a drive capability which can flow a current larger than a current of the transistor P91 (P92) turned on and draw out charge of the gate of the transistor P92 (p91) to turn on the transistor P92 (P91). The resistance R91 (R92) functions so as to limit the current of the transistor P91 (P92) and quickly drop the gate voltage of the transistor P92 (P91) by the voltage drop. Therefore, it is possible to quickly turn on the transistor P92 (P91). The drive capability of the transistor N91 (N92) need not be larger than necessity and the speed of the level shift circuit can be increased.

Moreover, as shown in FIG. 2, Japanese Patent Laid-Open No. 1992-284021 (Patent Document 2) discloses an output circuit (level shift circuit) which uses diode-coupled transistors P93 and P94 instead of the resistances R91 and R92. This document describes that an output OUT is taken out from the node B, but it is preferable to take out the output OUT by shaping waveform via an inverter in the same manner as in FIG. 1. The operation of the circuit is approximately the same as that of the circuit shown in FIG. 1. However, voltages of the node A and the node B (drain voltages of the transistors N91 and N92) drop by forward-direction voltage drops VF of the diode-coupled transistors P93 and P94, and thus the transistors P91 and P92 can be turned on with relative ease. That is, the circuit can operate even when the maximum voltage VDD1 of the input signal IN is further lower.

In this way, the level shift circuit converts a level of an input signal supplied from a circuit operated by a low supply voltage so that the input signal can drive a circuit operated by a high supply voltage. However, a time period for a signal amplitude to change from high level to low level or from low level to high level becomes long. In the time period in which the level changes, a through-current flows in the inverter, and thus a consumption current increases and noise caused by a peak of the consumption current increases.

SUMMARY

The present invention has been made in view of the above circumstances and provides a level shift circuit having a smaller through-current and a drive circuit of a display device including the level shift circuit.

Hereinafter, means for solving the problems will be described by using reference numerals and signs used in "DETAILED DESCRIPTION". The reference numerals and signs are added to clarify a correspondence relationship between descriptions in "What is claimed is:" and the "DETAILED DESCRIPTION". However, the reference numerals and signs may not be used to interpret the technical scope of the invention described in the "What is claimed is:".

According to an aspect of the present invention, a level shift circuit includes a first and a second MOS transistors (N1/N2) of a first conductivity type (N), a third and a fourth MOS transistors (P1/P2) of a second conductivity type (P) complementary to the first conductivity type (N), a first and a second voltage generation circuits (Z1/Z2), a fifth MOS transistor (P4) of the second conductivity type (P), and a sixth MOS transistor (N4) of the first conductivity type (N). An input signal (DI) having an amplitude between a third supply voltage (VDD1) indicating a voltage between a first supply voltage (VSS) and a second supply voltage (VDD2) and the first supply voltage (VSS) is input into the gate of the first MOS transistor (N1). An inverted input signal (DIB) which is an inverted signal of the input signal (DI) is input into the gate of the second MOS transistor (N2). The sources of the first and the second MOS transistors (N1/N2) are commonly coupled to the first supply voltage (VSS). The sources of the third and the fourth MOS transistors (P1/P2) are commonly coupled to the second supply voltage (VDD2), the gate of the third MOS transistor (P1) is coupled to the drain of the second MOS transistor (N2), and the gate of the fourth MOS transistor (P2) is coupled to the drain of the first MOS transistor (N1). The first voltage generation circuit (Z1) is coupled between the drain of the first MOS transistor (N1) and the drain of the third MOS transistor (P1), and the second voltage generation circuit (Z2) is coupled between the drain of the second MOS transistor (N2) and the drain of the fourth MOS transistor (P2). The gate of the fifth MOS transistor (P4) is coupled to a connection node (NDB) of the drain of the third MOS transistor (P1) and the first voltage generation circuit (Z1), and the source of the fifth MOS transistor (P4) is coupled to the second supply voltage (VDD2). The gate of the sixth MOS transistor (N4) is coupled to a connection node (NUB) of the drain of the first MOS transistor (N1) and the first voltage generation circuit (Z1). The source of the sixth MOS transistor (N4) is coupled to the first supply voltage (VSS). The drain of the sixth MOS transistor (N4) is coupled to the drain of the fifth MOS transistor (P4).

Moreover, in the level shift circuit, an output of an inverter (110) into which the input signal (DI) is input and which is operated by the first supply voltage (VSS) and the third supply voltage (VDD1) may be input into the gate of the second MOS transistor (N2) as the inverted input signal (DIB).

Furthermore, the level shift circuit may include a seventh MOS transistor (P3) of the second conductivity type (P), whose gate is coupled to a connection node (ND) of the drain of the fourth MOS transistor (P2) and the second voltage generation circuit (Z2) and whose source is coupled to the second supply voltage (VDD2), and an eighth MOS transistor (N3) of the first conductivity type (N), whose gate is coupled to a connection node (NU) of the drain of the second MOS transistor (N2) and the second voltage generation circuit (Z2), whose source is coupled to the first supply voltage (VSS), and whose drain is coupled to the drain of the seventh MOS transistor (P3).

From the viewpoint of another aspect of the present invention, a drive circuit of a display device includes a plurality of the level shift circuits.

In addition, from the viewpoint of another aspect of the present invention, the level shift circuit includes a level conversion unit (100) and a buffer unit (200). The level conversion unit (100) includes the first and the second voltage generation circuits (Z1/Z2), converts the input signals (DI/DIB) of a first signal level, which indicate a logic level by an amplitude between a reference supply voltage (VSS) and a first supply voltage (VDD1) into conversion signals of a second signal level, which indicate a logic level by an amplitude between the reference supply voltage (VSS) and a second supply voltage (VDD2), and outputs voltages of both ends (ND, NU/NDB, NDU) of the first and the second voltage generation circuits (Z1/Z2) as the conversion signals, respectively. Furthermore, the level conversion unit (100) includes a first transistor (P1) of the first conductivity type (P) and a second transistor (N1) of the second conductivity type (N), coupled in series between the second supply voltage (VDD2) and the reference supply voltage (VSS), and a third transistor (P2) of the first conductivity type (P) and a fourth transistor (N2) of the second conductivity type (N), coupled in series between the second supply voltage (VDD2) and the reference supply voltage (VSS). The first voltage generation circuit (Z1) is coupled between the drain of the first transistor (P1) and the drain of the second transistor (N1). The second voltage generation circuit (Z2) is coupled between the drain of the third transistor (P2) and the drain of the fourth transistor (N2). The buffer unit (200) includes transistors (P3, P4/N3, N4) of the first conductivity type (N) and the second conductivity type (P), where conversion signals are applied to the gates thereof, respectively. Output signals (DO/DOB) of the second signal level are output from connection nodes (DOB/DO) of the drains of the transistors (P3, P4/N3, N4) of the first conductivity type (N) and the second conductivity type (P).

EFFECTS OF THE INVENTION

According to the present invention, it is possible to provide a level shift circuit having a smaller through-current and a drive circuit of a display device including the level shift circuit.

DETAILED DESCRIPTION

An embodiment of the present invention will be described with reference to the drawings.

Figure 1:
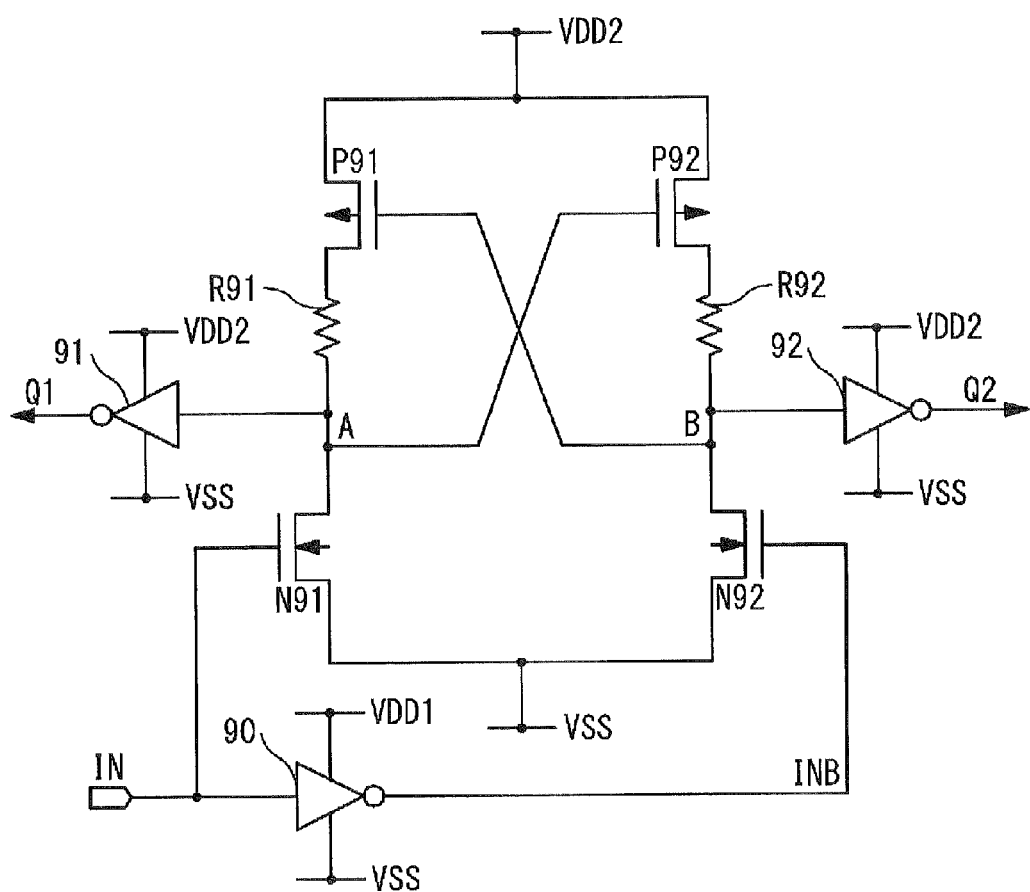
FIG. 1 is an equivalent circuit diagram showing a configuration of a level shift circuit of a related art.
Figure 2:
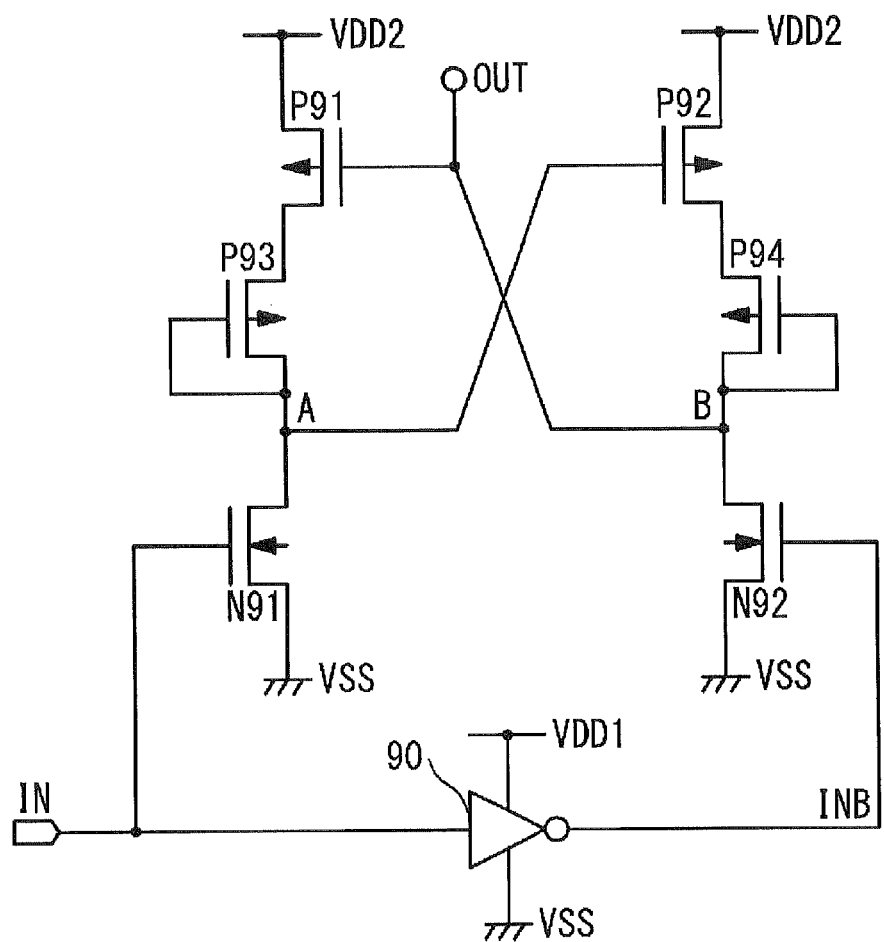
FIG. 2 is an equivalent circuit diagram showing another configuration of a level shift circuit of a related art.
Figure 3:
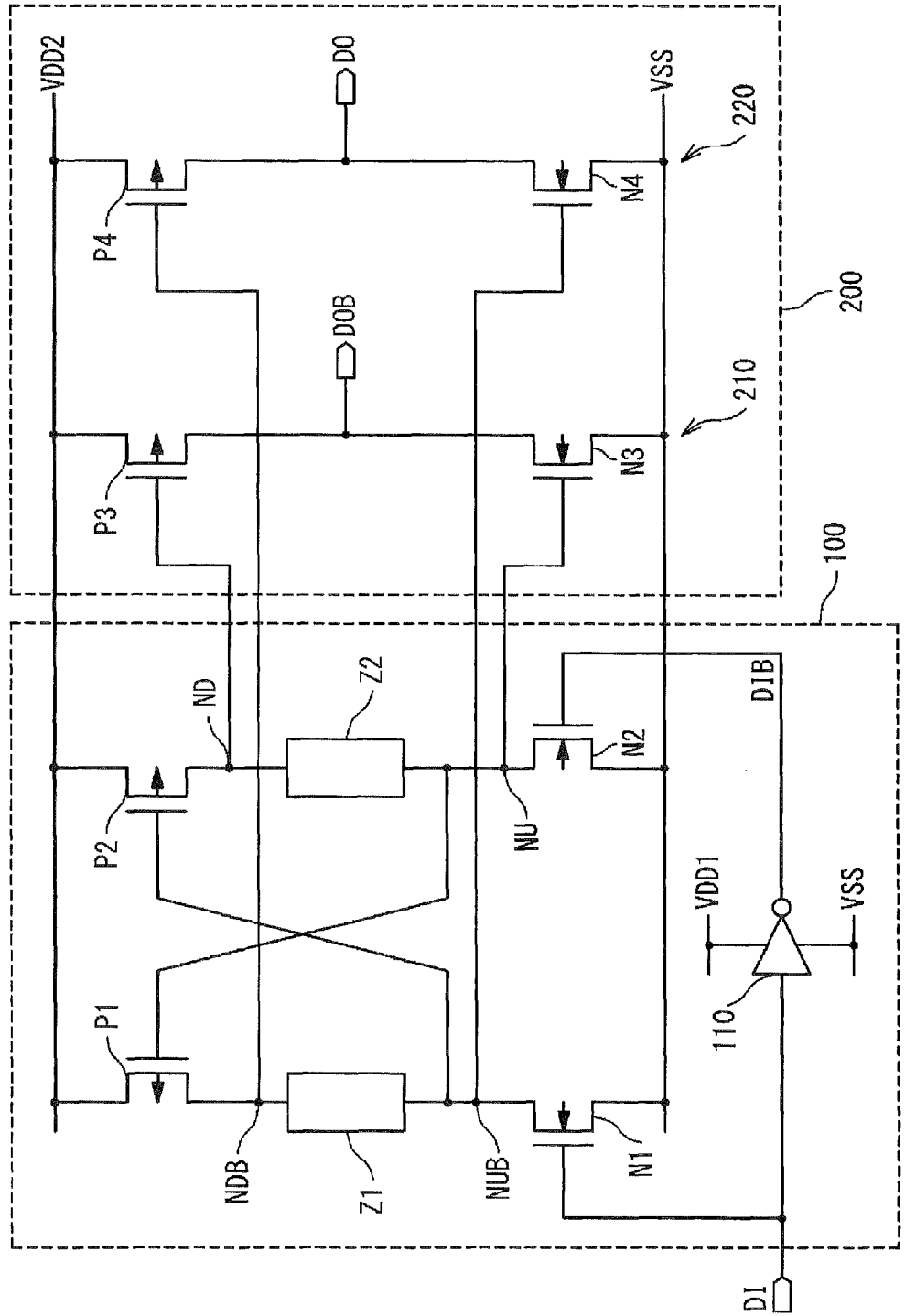
FIG. 3 is an equivalent circuit diagram showing a configuration of a level shift circuit according to an embodiment of the present invention.

FIG. 3 is an equivalent circuit diagram showing a configuration of a level shift circuit according to the embodiment of the present invention. The level shift circuit includes a level conversion unit 100 and a buffer unit 200. The level conversion unit 100 includes P-channel MOS transistors P1 and P2, N-channel MOS transistors N1 and N2, voltage generation circuits Z1 and Z2, and an inverter 110. The buffer unit 200 includes inverters 210 and 220, the inverter 210 includes a P-channel MOS transistor P3 and an N-channel MOS transistor N3, and the inverter 220 includes a P-channel MOS transistor P4 and an N-channel MOS transistor N4. The inverters 210 and 220 are circuits that output an inverted output signal and a normal output signal of the level shift circuit, respectively. If one of the output signals is not necessary, the corresponding inverter can be omitted.

The transistor P1, the voltage generation circuit Z1, and the transistor N1 are coupled in series between a high supply voltage VDD2 and a reference supply voltage VSS. The transistor P2, the voltage generation circuit Z2, and the transistor N2 are coupled in series between the high supply voltage VDD2 and the reference supply voltage VSS. The gate of the transistor P1 is coupled to a connection node NU of the voltage generation circuit Z2 and the drain of the transistor N2. The gate of the transistor P2 is coupled to a connection node NUB of the voltage generation circuit Z1 and the drain of the transistor N1. The node NU is coupled to the gate of the transistor N3 of the inverter 210 and the node NUB is coupled to the gate of the transistor N4 of the inverter 220. A connection node ND of the drain of the transistor P2 and the voltage generation circuit Z2 is coupled to the gate of the transistor P3 of the inverter 210. A connection node NDB of the drain of the transistor P1 and the voltage generation circuit Z1 is coupled to the gate of the transistor P4 of the inverter 220.

The inverter 110 logically inverts an input signal DI and outputs an input signal DIB. The input signal DI is applied to the gate of the transistor N1 and the input signal DIB is applied to the gate of the transistor N2. A low supply voltage VDD1 and the reference supply voltage VSS are applied to the inverter 110 and the input signals DI and DIB have an amplitude oscillating between the low supply voltage VDD1 and the reference supply voltage VSS. Signals indicated by the voltages of the nodes NU, NUB, ND, and NDB have an amplitude oscillating between the high supply voltage VDD2 and the reference supply voltage VSS. A set of the voltages of the nodes NU and ND drives the inverter 210 and a set of the voltages of the nodes NUB and NDB drives the inverter 220.

The transistor P3 and the transistor N3 are coupled in series between the high supply voltage VDD2 and the reference supply voltage VSS and form the inverter 210. The gate of the transistor P3 is coupled to the node ND and the gate of the transistor N3 is coupled to the node NU. An output signal DOB is output from a connection node of the drain of the transistor P3 and the drain of the transistor N3. The output signal DOB is a signal obtained by logically inverting the input signal DI and converting the signal level.

The transistor P4 and the transistor N4 are coupled in series between the high supply voltage VDD2 and the reference supply voltage VSS and form the inverter 220. The gate of the transistor P4 is coupled to the node NDB and the gate of the transistor N4 is coupled to the node NUB. An output signal DO is output from a connection node of the drain of the transistor P4 and the drain of the transistor N4. The output signal DO is a signal obtained by maintaining the logic of the input signal DI and converting the signal level.

From the viewpoint of the symmetry of the circuit, it is preferable that the transistors P1 and P2 and the transistors N1 and N2 have the same dimensions (W/L). It is also preferable that the voltage generation circuits Z1 and Z2 are circuits having the same circuit characteristics (or dimensions). In addition, it is desirable that the transistors P3 and P4 and the transistors N3 and N4 also have the same dimensions (W/L).

Figure 4:
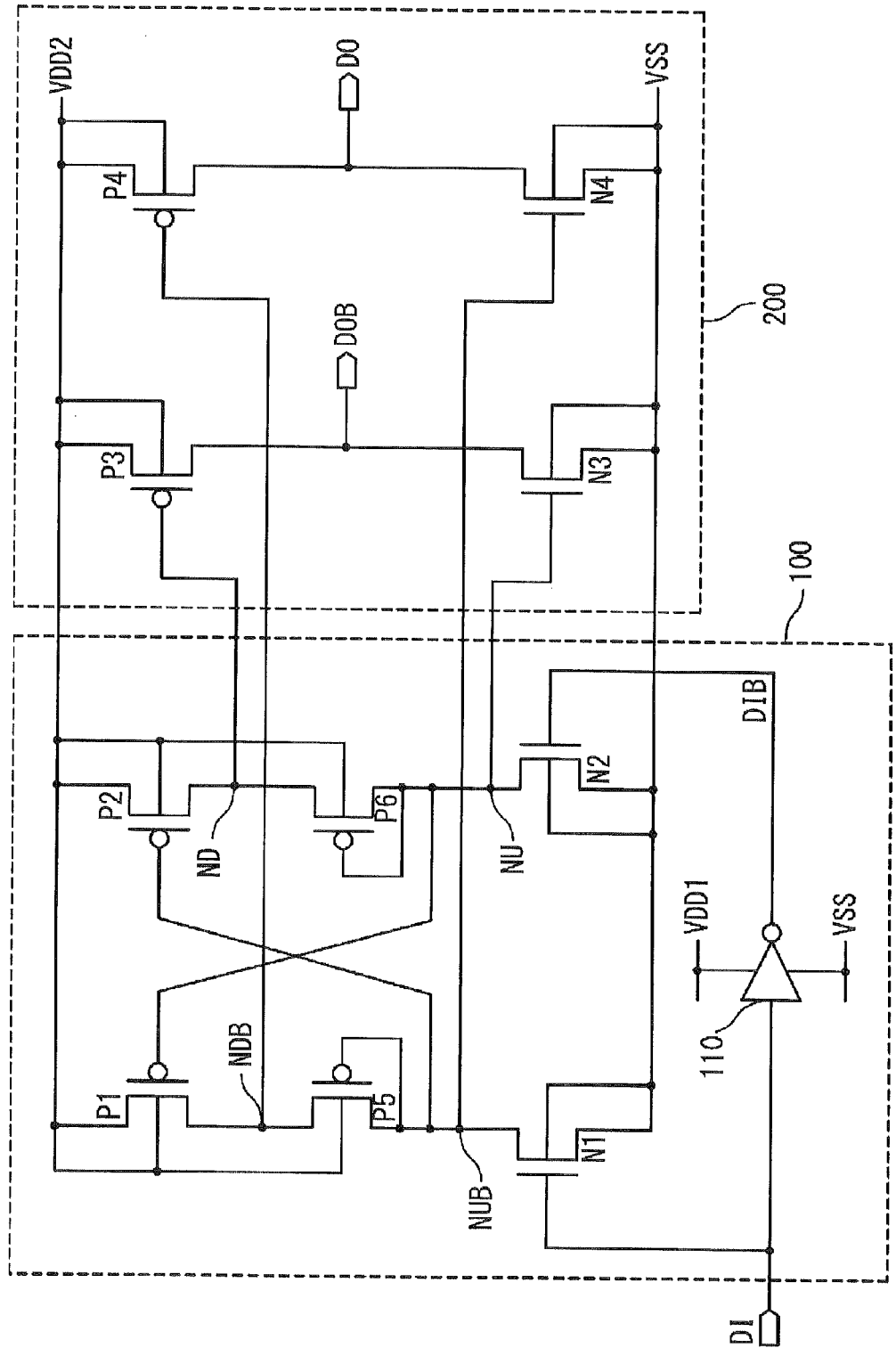
FIG. 4 is an equivalent circuit diagram showing a first configuration example of the level shift circuit according to the embodiment of the present invention.

As shown in FIG. 4, the voltage generation circuits Z1 and Z2 can use diode-coupled transistors P5 and P6 (First Example). In FIG. 4, each transistor is shown by a notation which clearly illustrates connection of the back gate. The transistors P5 and P6 are P-channel MOS transistors in the same manner as the transistors P1 to P4. The back gates of the P-channel MOS transistors are coupled to the high supply voltage VDD2. The back gates of the transistors N1 to N4, which are N-channel MOS transistors, are coupled to the reference supply voltage VSS. Here, the back gates of the transistors P5 and P6 are coupled to the high supply voltage VDD2, but may be coupled to their own sources.

Figure 5:
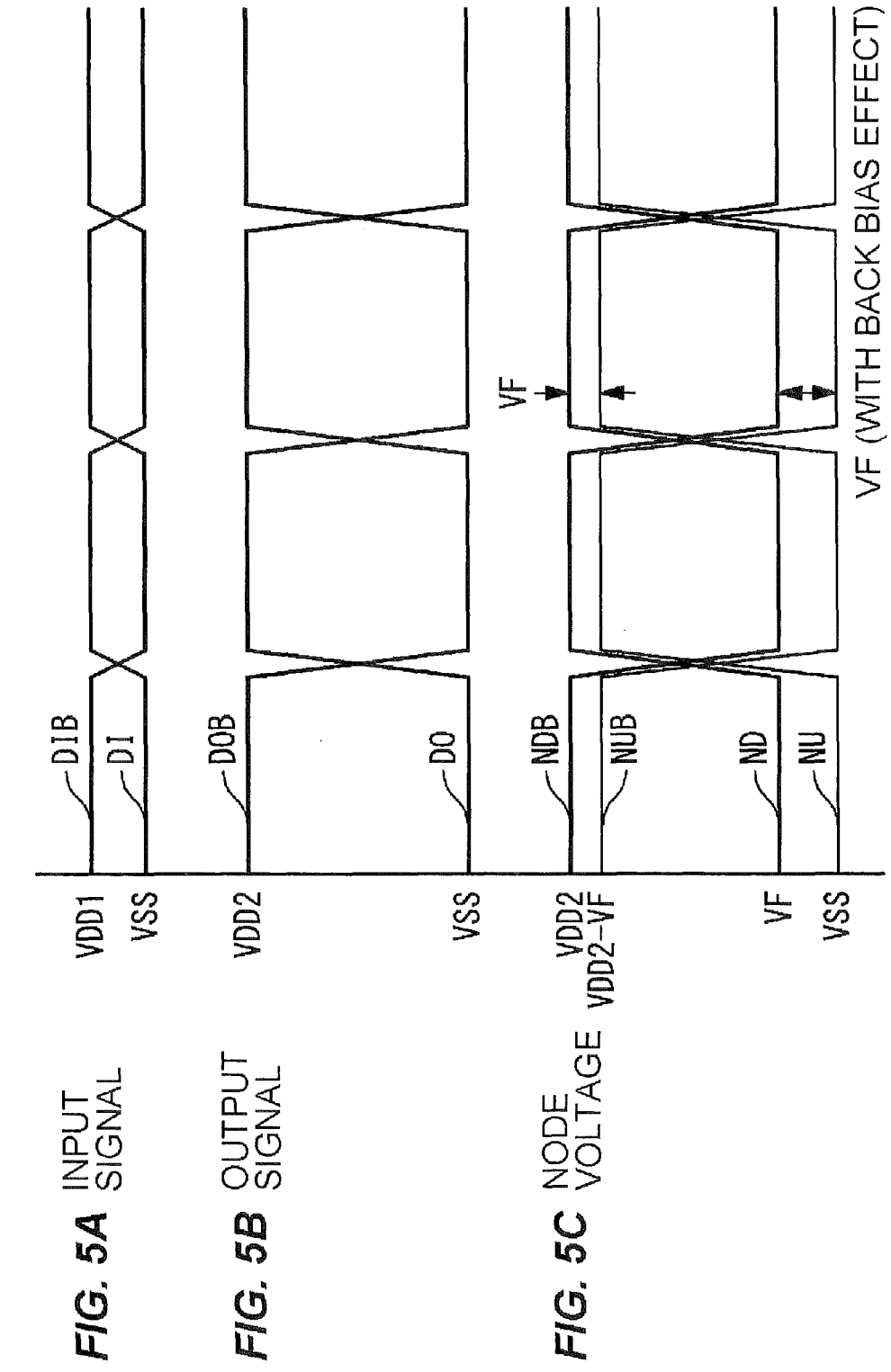
FIG. 5 is a timing chart for explaining an operation of the level shift circuit according to the embodiment of the present invention.

An operation of the level shift circuit shown in FIG. 4 will be described with reference to FIG. 5. In this level shift circuit, the high supply voltage VDD2 is applied to the back gates and the diode-coupled transistors P5 and P6 are used as the voltage generation circuits Z1 and Z2.

In a state in which a sufficient time has elapsed since the input signal DI indicated a low level (VSS) and thus the circuit is stable, the transistor N1 is in an off state because the input signal DI (low level) is applied to the gate. The transistor N2 is in an on state because the input signal DIE (high level) which is logically inverted by the inverter 110, is applied to the gate. The transistor N2 is in the on state, and thus the voltage of the node NU is low level (FIG. 5(c) NU) and the transistor P1 is in the on state. Although the transistor P1 is in the on state, the transistor N1 is in the off state, and thus no current flows in the transistor P1 and the voltage of the node NDB becomes a high level near the high supply voltage VDD2 (FIG. 5(c) NDB).

The diode-coupled transistor P5 has a diode forward-direction voltage drop (forward voltage) VF having a positive value from the drain coupled to the node NUB to the source coupled to the node NDB. Therefore, the voltage of the node NUB is a voltage (VDD2−VF) which is lower than the voltage (≈VDD2) of the node NDB by VF (FIG. 5(c) NUB). At this time, the back gate of the transistor P5 is coupled to the high supply voltage VDD2 and has the same voltage as the voltage of the source (≈VDD2), and thus no back bias effect is generated in the transistor P5. Moreover, the forward-direction voltage drop VF of the diode-coupled transistor P5 is the same as an absolute value of a threshold voltage Vtp. The absolute value of the threshold voltage Vtp of the transistor P5, that is, the forward-direction voltage drop VF, is sufficiently smaller than a voltage difference between the reference supply voltage VSS and the high supply voltage VDD2. The gate of the transistor P2 is coupled to the node NUB (VDD2−VF), and thus the gate-source voltage Vgs (−VF) is lower than or equal to the threshold voltage Vtp and the transistor P2 is in the off state. The transistor P2 is in the off state and the transistor N2 is in the on state, and thus the voltage of the node NU is low level (≈VSS) (FIG. 5(c) NU).

The diode-coupled transistor P6 has a diode forward-direction voltage drop (forward voltage) VF having a positive value from the drain to the source. Therefore, the voltage of the node ND is a voltage (VSS+VF) which is higher than the voltage (≈VSS) of the node NU by VF (FIG. 5(c) ND). The back gate of the transistor P6 is coupled to the high supply voltage VDD2. At this time, the source has a voltage that is VF higher than the reference supply voltage VSS, that is, a voltage lower than the high supply voltage VDD2, and thus, in the transistor P6, an absolute value of the threshold voltage Vtp (the forward-direction voltage drop VF as a diode) increases by the back bias effect and the forward-direction voltage drop VF of the diode-coupled transistor P6 becomes equal to the absolute value of the threshold voltage Vtp with the back bias effect. Also at this time, the absolute value of the threshold voltage Vtp of the transistor P6, that is, the forward-direction voltage drop VF, is a value sufficiently smaller than the voltage difference between the reference supply voltage VSS and the high supply voltage VDD2. Therefore, the voltage of the node ND is a low level indicating the forward-direction voltage drop VF with the back bias effect (FIG. 5(c) ND).

In such a stable condition, when the input signal DI changes from the low level (VSS) to the high level (VDD1), the input signal DIB which is logically inverted via the inverter 110, changes to the low level (VSS) immediately after the change of the input signal DI (FIG. 5(a)). The voltage that indicates the high level of the input signal DI is sufficiently higher than the threshold voltage Vtn of the transistor N1, and thus the transistor N1 changes to the on state. Moreover, the voltage that indicates the low level of the input signal DIE is lower than the threshold voltage Vtn of the transistor N2, and thus the transistor N2 changes to the off state. Immediately after the transistor N2 is turned off, the transistor P2 is also in the off state, and thus the voltages of the nodes NU and ND are maintained at the low level. Therefore, the transistor P1 is still in the on state, and a through-current Ii1 flows from the high supply voltage VDD2 to the reference supply voltage VSS via the diode-coupled transistor P5. The initial current value of the through-current is determined on the basis of on-resistances of the transistors P1, P5, and N1.

The voltage of the node NUB is determined by ratios of the on-resistances of the transistors P1, P5, and N1. When the voltage of the node NUB ($V_{NUB}$) becomes lower than a voltage obtained by adding the threshold voltage Vtp (negative value) to the high supply voltage VDD2, which is the source voltage of the transistor P2, ($V_{NUB}$<VDD2+Vtp), the transistor P2 becomes on state. At this time, the transistor N2 is in the off state, and thus the voltage of the node ND becomes high level (≈VDD2). Therefore, the voltage of the node NU becomes high level at a voltage lower than the voltage of the node ND by the forward-direction voltage drop (forward voltage) VF of the transistor P6. The source of the transistor P1 is coupled to the high supply voltage VDD2 and the gate is coupled to the node NU, and thus when the voltage of the node NU ($V_{NU}$) becomes higher than a voltage obtained by adding the threshold voltage Vtp (negative value) of the transistor P1 to the high supply voltage VDD2 ($V_{NU}$≥VDD2+Vtp), the transistor P1 becomes off state. When the transistor P1 becomes off state, the voltages of the nodes NDB and NUB become low level with a difference corresponding to the forward-direction voltage drop (forward voltage) VF of the transistor P5. Therefore, the voltage of the node NUB becomes approximately equal to the reference supply voltage VSS and the voltage of the node NDB becomes approximately a voltage of the forward-direction voltage drop VF of the transistor P5 (FIG. 5(c) NDB, NUB). At this time, by the back bias effect of the transistor P5, the forward-direction voltage drop VF becomes larger than that when there is no back bias effect. When a sufficient time has elapsed, the circuit is stabilized in a state opposite to the state of when the input signal DI is low level. Also when the input signal DI changes from high level to low level, the level shift circuit operates in the same principle because the circuit is symmetrical.

The transistors P3, N3, P4, and N4 in the buffer unit 200 operate responding to the changes of the voltages of the nodes ND, NU, NDB, and NUB. The source of the diode-coupled transistor P5 (corresponding to an anode of a diode) is the node NDB and the drain (corresponding to a cathode of a diode) is the node NUB. The source of the diode-coupled transistor P6 (anode) is the node ND and the drain (cathode) is the node NU. The diode-coupled transistors P5 and P6 are biased in the forward direction at all times. In this state, there is a voltage difference corresponding to the forward-direction voltage drop VF between the nodes ND and NU and between the nodes NDB and NUB. The forward-direction voltage drop VF of the diode-coupled P-channel MOS transistors is approximately equal to the absolute value of the threshold voltage Vtp. The back gate is coupled to the high supply voltage VDD2, and thus the back bias effect affects the value of the Vtp, that is, the forward-direction voltage drop VF. Specifically, as shown in FIG. 5(c), the forward-direction voltage drop VF when the voltages of the nodes ND and NDB are low becomes larger than that when the voltages of the nodes ND and NDB are high. This is because the nodes ND and NDB are the sources of the transistors P6 and P5 whose back gates are coupled to the high supply voltage VDD2, and thus when the voltages of the nodes ND and NDB become lower than the high supply voltage VDD2, the threshold voltage Vtp (the forward-direction voltage drop VF as a diode) increases by the back bias effect.

In the inverter 210 including the transistor P3 and the transistor N3, there is a voltage difference corresponding to the forward-direction voltage drop VF between the input voltages applied to the gates of the transistor P3 and the transistor N3. The gate voltages change while there is a voltage difference between them, and thus one transistor is turned off earlier than the other transistor. Since the one transistor is turned off earlier, a time period in which both transistors are in the on state at the same time decreases and the through-current decreases. Furthermore, the back gate of the diode-coupled P-channel MOS transistor P6 is coupled to the high supply voltage VDD2, and thus when the voltage of the output node ND of the level conversion unit 100 is lower than the high supply voltage VDD2, the source voltage of the diode-coupled transistor P6 decreases and the back bias effect increases. Thereby, the absolute value of the threshold voltage Vtp, that is, the value of the forward-direction voltage drop VF, increases, and thus the through-current can be further reduced. This also applies to the inverter 220 which includes the transistor P4 and the transistor N4.

The diode-coupled transistor P5 limits a drive current of the transistor P1 and functions so as to quickly lower the gate voltage of the transistor P2 by the forward-direction voltage drop VF. Therefore, it is possible to turn on the transistor P2 more quickly. Thus, the drive capability of the N-channel MOS transistor is not required to be large beyond necessity and the speed of the level shift circuit can be increased.

In other words, the voltage of the node NUB coupled to the gate of the P-channel MOS transistor P2 decreases by the forward-direction voltage drop VF of the diode-coupled P-channel MOS transistor P5. Therefore, the P-channel MOS transistor P2 can be relatively easily turned on and even when the input voltage VDD1 is low, that is, even when the drive current of the N-channel MOS transistor N1 is small, a stable operation can be performed. Then, the low level voltages applied to the gates of the P-channel MOS transistors P3 and P4 are the voltage VF including a back bias effect higher than that of the reference supply voltage VSS, and thus it is possible to reduce the consumption current caused by the through-current. Moreover, the diode-coupled P-channel MOS transistor P5 does not require a large drive capability, and thus it is possible to use a transistor having a small channel width W. As described above, regarding the level shift circuit according to the embodiment, the layout area can be reduced and the input voltage can be lowered while the value of the through-current is reduced.

Figure 6:
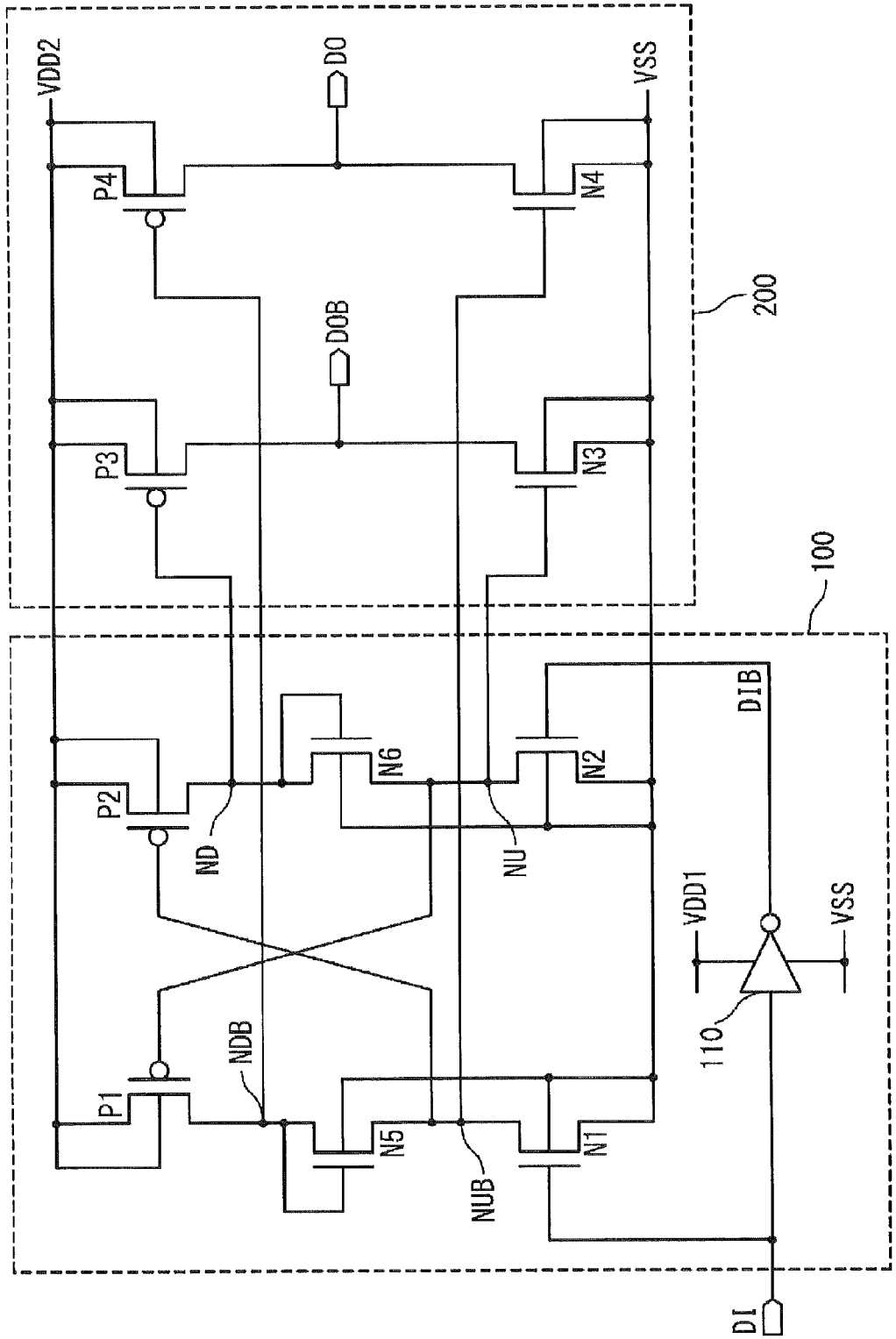
FIG. 6 is an equivalent circuit diagram showing a second configuration example of the level shift circuit according to the embodiment of the present invention.

In the above description, the diode-coupled P-channel MOS transistors P5 and P6 are exemplified as the voltage generation circuits Z1 and Z2. However, as shown in FIG. 6, the diode-coupled N-channel MOS transistors N5 and N6 may be the voltage generation circuits Z1 and Z2 (Second Example). The drain and the gate of the transistor N5 are coupled to each other. The drain and the gate of the transistor N6 are coupled to each other. The back gates of the transistors N5 and N6 are coupled to the reference supply voltage VSS. The operation of this level shift circuit is the same as that of the first configuration example, but in this case, the back bias effect appears in a high level voltage on the side of the high supply voltage VDD2. The effect is the same as that of the P-channel MOS transistors.

Figure 7:
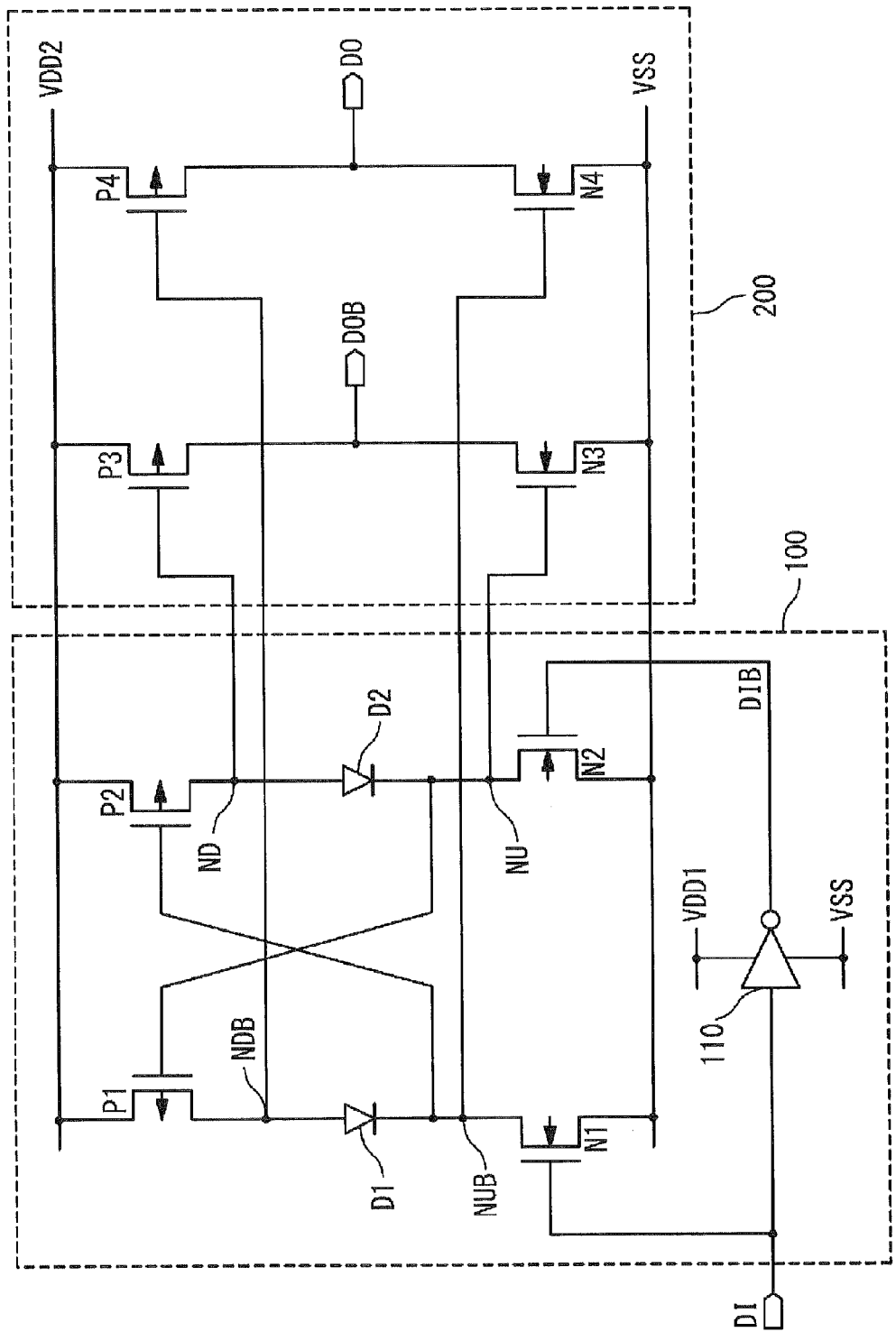
FIG. 7 is an equivalent circuit diagram showing a third configuration example of the level shift circuit according to the embodiment of the present invention.

Moreover, as shown in FIG. 7, the diodes D1 and D2 may be used as the voltage generation circuits Z1 and Z2 (Third Example). The diode D1 such as a PN junction is coupled between the transistor P1 and the transistor N1, and the diode D2 such as a PN junction is coupled between the transistor P2 and the transistor N2.

It is known that the forward-direction voltage drop VF of the PN junction is about 0.7 V when the material of the semiconductor is silicon, about 0.5 V when the material is germanium, and about 0.2 V when the PN junction is a Schottky barrier diode in which one side is metal. When a plurality of diodes is coupled in series as the voltage generation circuits Z1 and Z2, the forward-direction voltage drop VF_A of the voltage generation circuits Z1 and Z2 is calculated as VF_A=VF×the number of diodes. When the value of the forward-direction voltage drop VF_A is greater than the absolute value of the threshold voltage Vtp, the speed of the level shift circuit increases, but the P-channel MOS transistors P1 and P2 are not turned off completely. Therefore, a path in which current flows constantly is formed in the level shift circuit, and thus the power consumption increases. When the forward-direction voltage drop VF_A is excessively smaller than the threshold voltage Vtp, the P-channel MOS transistors P1 and P2 are completely turned off, and thus the power consumption at that time can be ignorable, but the effect of the present invention decreases. Therefore, it is preferable that the value of the forward-direction voltage drop VF_A is about the absolute value of the threshold voltage Vtp of the P-channel MOS transistors P1 and P2.

Figure 8:
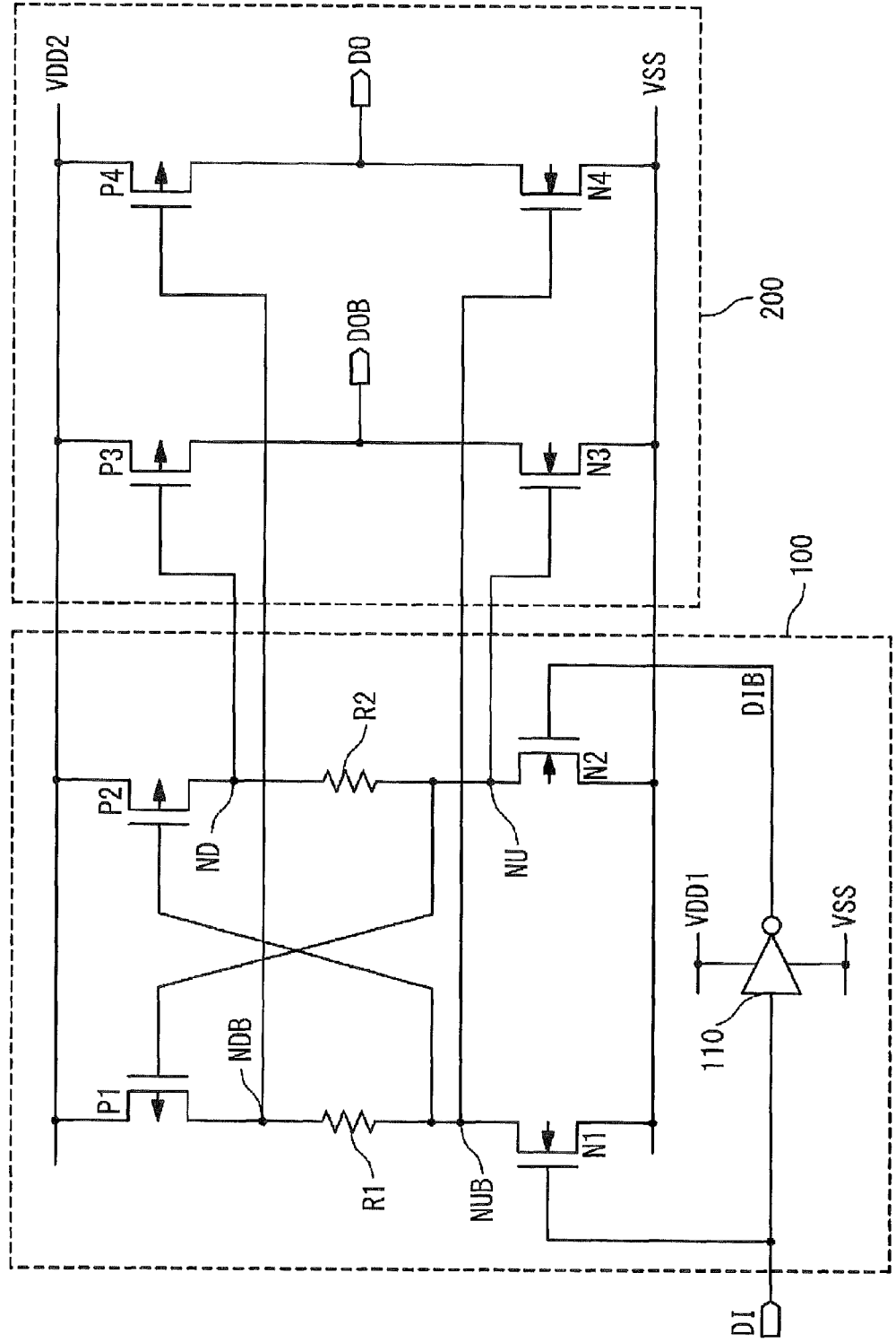
FIG. 8 is an equivalent circuit diagram showing a fourth configuration example of the level shift circuit according to the embodiment of the present invention.

Moreover, as shown in FIG. 8, the resistances R1 and R2 may be used as the voltage generation circuits Z1 and Z2 (Fourth Example). When the resistances R1 and R2 are used, the voltage drop by each resistance depends on a current flowing in the resistance, and thus it is necessary to increase the resistance value in order to ensure a voltage in an area where the current value is small. However, in a state in which a level change of a signal is completed and the signal is stabilized, no current flows in the resistances R1 and R2, and thus the voltages of the node ND and the node NU are the same and the voltages of the node NDB and the node NUB are the same. When the signal level is high, the voltage is approximately the same as the high supply voltage VDD2, and when the signal level is low, the voltage is approximately the same as the reference supply voltage VSS, and thus it is possible to reliably turn on and off the transistors.

Figure 9:
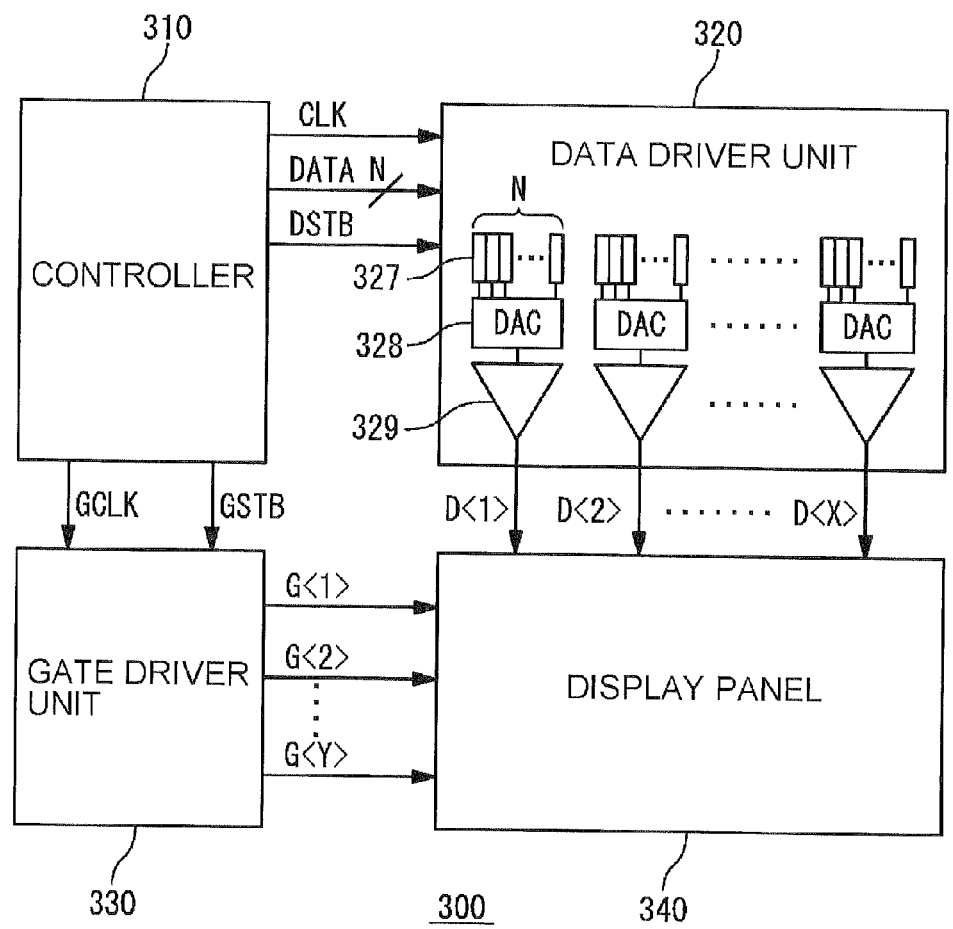
FIG. 9 is a block diagram showing a configuration of a display device according to the embodiment of the present invention.

FIG. 9 is a block diagram showing a configuration of a display device according to the embodiment of the present invention. A display device 300 includes a controller 310, a data driver unit 320, a gate driver unit 330, and a display panel 340. The display panel 340 is a liquid crystal display panel on which pixels are arranged in a matrix, and displays a display image. The controller 310 supplies a control signal and a data signal to the data driver unit 320 and the gate driver unit 330 on the basis of a signal which is supplied from the outside and which represents a display image and a control signal of the signal representing the display image. A clock signal CLK indicating a timing, a data strobe signal DSTB, and a display data signal DATA are supplied to the data driver unit 320. A gate clock signal GCLK and a gate strobe signal GSTB are supplied to the gate driver unit 330.

The data driver unit 320 outputs data line signals D<1> to D<X> to pixel lines in a column direction on the display panel 340 on the basis of the display data signal DATA, the clock signal CLK, and the data strobe signal DSTB. A plurality of drive circuits 329 that drive the data line signals D<1> to D<X> is voltage-follower-coupled differential amplifier circuits. The gate driver unit 330 outputs gate line signals G<1> to G<Y> to pixel lines in a line direction on the display panel 340 on the basis of the gate clock signal GCLK and the gate strobe signal GSTB. In the data driver unit 320, the level shift circuits 327 described above, for generating the data line signals D<1> to D<X> corresponding to a high voltage signal (VDD2), which is a level of the data signal, from DATA of a low voltage signal (VDD1) and the number of which is a number obtained by multiplying the number of data lines (X) by a bit width (N) of the DATA, are incorporated; and all the level shift circuits 327 operate at approximately the same time at the timing of line display. Outputs of the level shift circuits 327 are input into digital-analog conversion circuits (DACs) 328 and output analog signals of the DACs 328 are amplified by the drive circuits 329 and output to data lines (not shown) of the display panel 340 as the data line signals D<1> to D<X>.

For example, when the display panel 340 is a full high vision vertical stripe color panel of three primary colors (FHD: 1,920 columns×1,080 lines), the number of outputs (X) of the data driver unit 320 becomes 5,760 (=1,920×three primary colors). At this time, when the bit width of the DATA signal is 8 bits (full color: about 16,770,000 colors), the number of level shifters mounted on the data driver unit 320 becomes 46,080. On the display device, when there is displayed a pattern in which black (00000000) lines and white (11111111) lines of the DATA for each line are alternately repeated, such as a white/black column checkered pattern and a white/black horizontal lines display, 46,080 level shifters 327 operate at approximately the same time for each line. Furthermore, the above operation is repeated for 1,080 lines in one frame, and one frame is displayed 60 times per second (normal speed display) to 240 times per second (quad-speed display or 3D of double speed display). This means that 46,080 level shift circuits 327 change value 25,920 times per second, that is, the through-current flows 25,920 times per second. As described above, the level shift circuits of the present invention can significantly reduce the consumption current and the noise caused by a current peak in the entire display device even though each level shift circuit reduces a small amount of through-current.

Although the present invention has been described with reference to the embodiment, Examples of the embodiment can be combined and implemented as long as no contradiction occurs. Furthermore, the present invention is not limited to the embodiment described above, and various modifications that can be understood by those skilled in the art can be made in the configurations and details of the present invention within the scope of the present invention.

What is claimed is:

1. A level shift circuit comprising:
a first MOS (Metal-Oxide Semiconductor) transistor of a first conductivity type, into a gate of which an input signal having an amplitude between a third supply voltage indicating a voltage between a first supply voltage and a second supply voltage and the first supply voltage is input;
a second MOS transistor of the first conductivity type, into a gate of which an inverted input signal which is an inverted signal of the input signal, is input, sources of the first and the second MOS transistors being commonly coupled to the first supply voltage;
a third MOS transistor of a second conductivity type complementary to the first conductivity type, whose gate is coupled to a drain of the second MOS transistor;
a fourth MOS transistor of the second conductivity type, whose gate is coupled to a drain of the first MOS transistor, sources of the third and the fourth MOS transistors being commonly coupled to the second supply voltage;
a first voltage generation circuit coupled between the drain of the first MOS transistor and a drain of the third MOS transistor;
a second voltage generation circuit coupled between the drain of the second MOS transistor and a drain of the fourth MOS transistor;
a fifth MOS transistor of the second conductivity type, whose gate is coupled to a connection node of the drain of the third MOS transistor and the first voltage generation circuit and whose source is coupled to the second supply voltage;
a sixth MOS transistor of the first conductivity type, whose gate is coupled to a connection node of the drain of the first MOS transistor and the first voltage generation circuit, whose source is coupled to the first supply voltage, and whose drain is coupled to a drain of the fifth MOS transistor; and
an inverter into which the input signal is input, and which logically inverts the input signal and outputs the inverted input signal, wherein the first voltage generation circuit includes a PN junction diode whose cathode is coupled to the drain, of the first MOS transistor and whose anode is coupled to the drain of the third MOS transistor, and
the second voltage generation circuit includes a PN junction diode whose cathode is coupled to the drain of the second MOS transistor and whose anode is coupled to the drain of the fourth MOS transistor,
wherein at least one of the first, second, third, fourth, fifth and sixth MOS transistors includes a bias connection.

2. The level shift circuit according to claim 1, further comprising:
a seventh MOS transistor of the second conductivity type, whose gate is coupled to a connection node of the drain of the fourth MOS transistor and the second voltage generation circuit and whose source is coupled to the second supply voltage; and
an eighth MOS transistor of the first conductivity type, whose gate is coupled to a connection node of the drain of the second MOS transistor and the second voltage generation circuit, whose source is coupled to the first supply voltage, and whose drain is coupled to a drain of the seventh MOS transistor.

3. The level shift circuit according to claim 1,
wherein the first voltage generation circuit includes a ninth MOS transistor of the second conductivity type, whose drain and gate are coupled together to form a cathode which is coupled to the drain of the first MOS transistor and whose source is used as an anode which is coupled to the drain of the third MOS transistor, and
the second voltage generation circuit includes a tenth MOS transistor of the second conductivity type, whose drain and gate are coupled together to form a cathode which is coupled to the drain of the second MOS transistor and whose source is used as an anode which is coupled to the drain of the fourth MOS transistor.

4. The level shift circuit according to claim 1,
wherein the first voltage generation circuit includes an eleventh MOS transistor of the first conductivity type, whose drain is used as a cathode which is coupled to the drain of the first MOS transistor and whose source and gate are coupled together to form an anode which is coupled to the drain of the third MOS transistor, and
the second voltage generation circuit includes a twelfth MOS transistor of the first conductivity type, whose drain is used as a cathode which is coupled to the drain of the second MOS transistor and whose source and gate are coupled together to form an anode which is coupled to the drain of the fourth MOS transistor.

5. The level shift circuit according to claim 1,
wherein the first voltage generation circuit includes a resistance coupled to the drain of the first MOS transistor and the drain of the third MOS transistor, and
the second voltage generation circuit includes a resistance coupled to the drain of the second MOS transistor and the drain of the fourth MOS transistor.

6. A drive circuit of a display device, the drive circuit comprising:
a plurality of level shift circuits according to claim 1.

7. The level shift circuit according to claim 1, wherein voltages applied to the gate of the fifth MOS transistor comprise a first voltage including a back bias effect higher than the reference supply voltage.

8. The level shift circuit according to claim 1, wherein the gates of the first, second, third, fourth, fifth and sixth MOS transistors are biased.

9. A level shift circuit comprising:
a level conversion unit which includes a first and a second voltage generation circuits, converts an input signal of a first signal level, which indicates a logic level by an amplitude between a reference supply voltage and a first supply voltage, into a conversion signal of a second signal level, which indicates a logic level by an amplitude between the reference supply voltage and a second supply voltage, and outputs voltages of both ends of the first and the second voltage generation circuits as conversion signals respectively; and
a buffer unit which includes transistors of a first conductivity type and a second conductivity type, to gates of which the conversion signals are applied respectively, and outputs an output signal of the second signal level from a connection node of drains of the transistors of the first conductivity type and the second conductivity type,
wherein the level conversion unit further includes:
a first transistor of the first conductivity type and a second transistor of the second conductivity type, coupled in series between the second supply voltage and the reference supply voltage, and
a third transistor of the first conductivity type and a fourth transistor of the second conductivity type, coupled in series between the second supply voltage and the reference supply voltage,
the first voltage generation circuit is coupled between a drain of the first transistor and a drain of the second transistor, and
the second voltage generation circuit is coupled between a drain of the third transistor and a drain of the fourth transistor,
wherein the buffer unit includes:
a seventh transistor of the first conductivity type, whose gate is coupled to a connection node of the second voltage generation circuit and the third transistor, and
an eighth transistor of the second conductivity type, whose gate is coupled to a connection node of the second voltage generation circuit and the fourth transistor,
the seventh transistor and the eighth transistor are coupled in series between the second supply voltage and the reference supply voltage, and
a second output signal of the second signal level, which indicates an inverted logic of a logic indicated by the input signal, is output from a connection node of a drain of the seventh transistor and a drain of the eighth transistor,
wherein the first voltage generation circuit includes a PN junction diode whose cathode is coupled to the drain, of the first MOS transistor and whose anode is coupled to the drain of the third MOS transistor, and
the second voltage generation circuit includes a PN junction diode whose cathode is coupled to the drain of the second MOS transistor and whose anode is coupled to the drain of the fourth MOS transistor,
wherein at least one of the first, second, third, and fourth transistors includes a bias connection.
10. The level shift circuit according to claim 9,
wherein the buffer unit includes
a fifth transistor of the first conductivity type, whose gate is coupled to a connection node of the first voltage generation circuit and the first transistor, and
a sixth transistor of the second conductivity type, whose gate is coupled to a connection node of the first voltage generation circuit and the second transistor, the fifth transistor and the sixth transistor are coupled in series between the second supply voltage and the reference supply voltage, and
a first output signal of the second signal level, which indicates a logic indicated by the input signal, is output from a connection node of a drain of the fifth transistor and a drain of the sixth transistor.
11. The level shift circuit according to claim 9,
wherein the first and the second voltage generation circuits include a ninth and a tenth MOS transistors of the first conductivity type, which are coupled by coupling a drain and a gate to form a cathode and using a source as an anode,
wherein:
the first transistor of the first conductivity type and the second transistor of the second conductivity type, are coupled directly in series between the second supply voltage and the reference supply voltage,
the third transistor of the first conductivity type and the fourth transistor of the second conductivity type, are coupled directly in series between the second supply voltage and the reference supply voltage,
the first voltage generation circuit is coupled directly between a drain of the first transistor and a drain of the second transistor, and
the second voltage generation circuit is coupled directly between a drain of the third transistor and a drain of the fourth transistor.
12. A level shift circuit comprising:
a first transistor of a first conductivity type, into a gate of which an input signal having an amplitude between a third supply voltage indicating a voltage between a first supply voltage and a second supply voltage and the first supply voltage is input;
a second transistor of the first conductivity type, into a gate of which an inverted input signal which is an inverted signal of the input signal, is input, sources of the first and the second transistors being coupled to the first supply voltage;
a third transistor of a second conductivity type complementary to the first conductivity type, whose gate is coupled to a drain of the second transistor;
a fourth transistor of the second conductivity type, whose gate is coupled to a drain of the first transistor, sources of the third and the fourth transistors being commonly coupled to the second supply voltage;
a fifth transistor of the second conductivity type, whose gate is coupled to a connection node of the drain of the third transistor and whose source is coupled to the second supply voltage; and
a sixth transistor of the first conductivity type, whose gate is coupled to a connection node of the drain of the first transistor, whose source is coupled to the first supply voltage, and whose drain is coupled to a drain of the fifth transistor,
wherein at least one of the first, second, third, fourth, fifth and sixth MOS transistors includes a bias connection.
13. The level shift circuit according to claim 12, further comprising a first voltage generation circuit coupled between the drain of the first transistor and a drain of the third transistor;
a fifth transistor of the second conductivity type, whose gate is coupled to a connection node of the drain of the third transistor and the first voltage generation circuit and whose source is coupled to the second supply voltage, and wherein the sixth transistor of the first conductivity type, whose gate is coupled to the connection node of the drain of the first transistor and the first voltage generation circuit in common.

14. The level shift circuit according to claim 12, further comprising a second voltage generation circuit coupled between the drain of the second transistor and a drain of the fourth transistor.

15. The level shift circuit according to claim 14, further comprising:
- a seventh transistor of the second conductivity type, whose gate is coupled to a connection node of the drain of the fourth transistor and the second voltage generation circuit and whose source is coupled to the second supply voltage; and
- an eighth transistor of the first conductivity type, whose gate is coupled to a connection node of the drain of the second transistor and the second voltage generation circuit, whose source is coupled to the first supply voltage, and whose drain is coupled to a drain of the seventh transistor.

16. The level shift circuit according to claim 12, wherein the first voltage generation circuit includes a ninth transistor of the second conductivity type, whose drain and gate are coupled together to form a cathode which is coupled to the drain of the first transistor and whose source is used as an anode which is coupled to the drain of the third transistor, and
the second voltage generation circuit includes a tenth transistor of the second conductivity type, whose drain and gate are coupled together to form a cathode which is coupled to the drain of the second transistor and whose source is used as an anode which is coupled to the drain of the fourth transistor.

17. The level shift circuit according to claim 13, wherein the first voltage generation circuit includes an eleventh transistor of the first conductivity type, whose drain is used as a cathode which is coupled to the drain of the first transistor and whose source and gate are coupled together to form an anode which is coupled to the drain of the third transistor.

18. The level shift circuit according to claim 14, wherein the second voltage generation circuit includes a twelfth transistor of the first conductivity type, whose drain is used as a cathode which is coupled to the drain of the second transistor and whose source and gate are coupled together to form an anode which is coupled to the drain of the fourth transistor.

19. The level shift circuit according to claim 12, further comprising:
- an inverter into which the input signal is input, and which logically inverts the input signal and outputs the inverted input signal,
- wherein the first voltage generation circuit includes a PN junction diode whose cathode is coupled to the drain, of the first MOS transistor and whose anode is coupled to the drain of the third MOS transistor, and
- the second voltage generation circuit includes a PN junction diode whose cathode is coupled to the drain of the second MOS transistor and whose anode is coupled to the drain of the fourth MOS transistor.

* * * * *